United States Patent
Shih et al.

(10) Patent No.: US 7,998,821 B2
(45) Date of Patent: Aug. 16, 2011

(54) METHOD OF MANUFACTURING COMPLEMENTARY METAL OXIDE SEMICONDUCTOR TRANSISTOR

(75) Inventors: Hung-Lin Shih, Hsinchu (TW); Tsan-Chi Chu, Hsin-Chu (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 62 days.

(21) Appl. No.: 11/538,815

(22) Filed: Oct. 5, 2006

(65) Prior Publication Data

US 2008/0085577 A1    Apr. 10, 2008

(51) Int. Cl.
*H01L 21/336* (2006.01)

(52) U.S. Cl. .......... 438/301; 257/E21.633; 257/E21.634; 257/E21.64; 257/E21.43; 438/199; 438/231

(58) Field of Classification Search ........... 257/E21.633, 257/E21.626, E21.431, E21.438, 69, 204, 257/E21.634, E21.43, E21.64; 438/197, 438/478, 199, 142, 300–307, 230, 231, 299, 438/275, 519, 373, 222, 185
See application file for complete search history.

(56) References Cited

U.S. PATENT DOCUMENTS

| | | | |
|---|---|---|---|
| 5,268,324 A | 12/1993 | Aitken | |
| 5,913,116 A * | 6/1999 | Gardner et al. | 438/231 |
| 5,970,351 A * | 10/1999 | Takeuchi | 438/300 |
| 6,159,815 A * | 12/2000 | Lustig et al. | 438/305 |
| 6,274,894 B1 * | 8/2001 | Wieczorek et al. | 257/192 |
| 6,300,201 B1 | 10/2001 | Shao | |
| 6,362,034 B1 | 3/2002 | Sandford | |
| 6,632,718 B1 | 10/2003 | Grider | |
| 6,699,763 B2 | 3/2004 | Grider | |
| 7,078,285 B1 | 7/2006 | Suenaga | |
| 7,176,110 B2 * | 2/2007 | van Bentum et al. | 438/478 |
| 7,176,522 B2 * | 2/2007 | Cheng et al. | 257/338 |
| 7,348,232 B2 | 3/2008 | Chidambaram | |
| 7,378,305 B2 * | 5/2008 | Hatada et al. | 438/153 |
| 7,390,707 B2 | 6/2008 | Kawamura | |
| 7,402,496 B2 * | 7/2008 | Liu et al. | 438/300 |
| 7,407,860 B2 | 8/2008 | Kim | |
| 7,491,615 B2 * | 2/2009 | Wu et al. | 438/300 |
| 7,579,262 B2 * | 8/2009 | Hoentschel et al. | 438/478 |
| 2005/0035409 A1 * | 2/2005 | Ko et al. | 257/350 |
| 2005/0035470 A1 * | 2/2005 | Ko et al. | 257/900 |
| 2005/0093084 A1 * | 5/2005 | Wang et al. | 257/410 |
| 2006/0024876 A1 * | 2/2006 | Chidambaram et al. | 438/198 |
| 2006/0046367 A1 * | 3/2006 | Rotondaro et al. | 438/199 |
| 2006/0157797 A1 * | 7/2006 | Tateshita | 257/369 |
| 2006/0199285 A1 * | 9/2006 | Chidambaram et al. | 438/14 |
| 2006/0286736 A1 * | 12/2006 | Orlowski et al. | 438/199 |
| 2007/0020839 A1 * | 1/2007 | Sridhar et al. | 438/199 |

(Continued)

FOREIGN PATENT DOCUMENTS

TW    304285    5/1997

(Continued)

*Primary Examiner* — Matthew Landau
*Assistant Examiner* — Latanya N Crawford
(74) *Attorney, Agent, or Firm* — Winston Hsu; Scott Margo

(57) ABSTRACT

A method of manufacturing a CMOS is disclosed. A substrate has a first gate and a second gate. A dielectric layer and a patterned photo-resist layer are formed sequentially on the substrate. After an etching process, the dielectric layer without the photo-resist layer forms a spacer around the first gate, and the dielectric layer with the photo-resist layer forms a block layer on the second gate. The recesses are formed in the substrate of two lateral sides of the first gate. The epitaxial silicon layers are formed in the recesses.

14 Claims, 15 Drawing Sheets

U.S. PATENT DOCUMENTS

| | | | |
|---|---|---|---|
| 2007/0200179 A1* | 8/2007 | Chen | 257/369 |
| 2007/0235802 A1* | 10/2007 | Chong et al. | 257/346 |
| 2007/0298574 A1* | 12/2007 | Ekbote et al. | 438/303 |
| 2008/0029815 A1* | 2/2008 | Chen et al. | 257/347 |
| 2008/0085577 A1* | 4/2008 | Shih et al. | 438/199 |

FOREIGN PATENT DOCUMENTS

| | | |
|---|---|---|
| TW | 445632 | 7/2001 |
| TW | 448512 | 8/2001 |
| TW | 481895 | 4/2002 |
| TW | 200400569 | 1/2004 |

* cited by examiner

METHOD OF MANUFACTURING COMPLEMENTARY METAL OXIDE SEMICONDUCTOR TRANSISTOR

BACKGROUND OF THE INVENTION

1. Field of the Invention

The present invention relates to a method of manufacturing a complementary metal oxide semiconductor transistor (CMOS). The feature of the present invention is that there is no additional process for forming the cap layer as the hard mask of the continued recess etching process and the selective epitaxial growth.

2. Description of the Prior Art

As semiconductor components become smaller, transistor manufacture has been improved significantly in order to manufacture transistors of small volume and high quality. When a salicide (self-aligned silicide) process is performed on a small transistor, the silicon substrates of the source/drain are depleted excessively. This results in the crystal lattices of the source/drain being damaged, and the PN junction between the source/drain and the substrate being too close to the silicide, causing leakage, and the component to lose efficacy.

Therefore, current transistor manufacturing processes utilize a selective epitaxial growth (SEG) process to build a high source/drain of the transistor, so that the silicide is formed without depletion of the silicon substrate, and the efficacy of the component is thereby increased.

Please refer to FIGS. 1 to 5. FIGS. 1 to 5 are schematic diagrams of manufacturing a CMOS transistor according to the prior art. As FIG. 1 shows, a substrate 102 includes an N well 104, a P well 106, and a shallow trench isolation (STI) 108. A plurality of gate structures 110 and 112 are deposited on the substrate 102. The gate structure 110 is formed on the N well 104; the gate structure 112 is formed on the P well 106, and the STI 108 is formed between the adjacent gate structures 110 and 112 in the substrate 102. The substrate 102 is a P type silicon substrate, and the gate structures 110, 112 are made from conductive material such as poly-silicon.

Next, a first light ion implanting process is performed by a mask (not shown), and P type light dopant drains 114 are formed in the N well 104 of the two lateral sides of the gate 110. Afterwards, a second light ion implanting process is performed by another mask (not shown), and N type light dopant drains 116 are formed in the P well 106 of the two lateral sides of the gate 112. The sequence of forming the P type light dopant drain and the N type light dopant drain can be alternated. Subsequently, a dielectric layer (not shown) is deposited on the substrate 102 to cover the gate structures 110 and 112. Next, an anisotropic etch process is performed on the dielectric layer, so as to form a spacer 122 around the gate structures 110, 112.

Please refer to FIG. 2. A patterned photo-resist layer 202 covers the P well 106 and the gate structure 110. Subsequently, the gate structure 110, the spacer 122 around the gate structure 110, and the patterned photo-resist layer 202 form a mask on which a P− ion implanting process is performed, so as to form a P− dopant region 204 outside the spacer 122 and in the N well 104. Next, the patterned photo-resist layer 202 is removed.

Please refer to FIG. 3. A cap layer (not shown) is deposited on the substrate 102. And than, a patterned photo-resist layer 304 is selectively formed on the cap layer and the P well 106. The gate structure 110, the spacer 122 around the gate structure 110, and the patterned photo-resist layer 304 form a mask on which is performed a P+ ion implanting process, so as to form a P+ dopant region 306 outside the spacer 122 and the N well 104. Then, an etching process is performed, and the cap layer becomes the patterned photo-resist layer 304. Next, the patterned photo-resist layer 304 is then removed.

Please refer to FIG. 4. The patterned cap layer 302, the gate structure 110, and the spacer around the gate structure 110 form the mask. An etching process is performed by appropriate etching selectivity and a recess 400 is formed outside between the spacer 122 and the STI 108 and in the N well 104. Next, a SEG process is performed, and an epitaxial silicon layer 402 is formed in each recess 400. The material of the epitaxial silicon layer 402 could be silicon, SiGe, or SiC. Subsequently, the patterned cap layer 302 is removed.

Please refer to FIG. 5. Another patterned photo-resist layer (not shown) is formed on the N well 104. The gate structure 112 and the spacer 122 around the gate structure 112 form the mask. An N+ ion implanting process is performed to form a source/drain 502 outside the spacer 122 around the gate structure 112 and in the P well 106. The source/drain 502 are the N+ dopant regions. Next, the patterned photo-resist layer is removed.

Afterwards, another patterned photo-resist layer (not shown) is formed on the P well 106. The gate structure 110 and the spacer 122 around the gate structure 110 form the mask. A P+ ion implanting process is performed to form the source/drain 504 outside the spacer 122 around the gate structure 110 in the N well 104. The source/drain 504 are P+ dopant regions. Next, the patterned photo-resist layer is removed. Then, an annealing process is performed to activate the dopant in the substrate, and repair the crystal lattice in the surface of the substrate 102, which is damaged by the ion implanting processes. Of course, the sequence of forming the source/drain can be alternated.

At this point, the above-mentioned manufacture is completed. The N channel MOS (NMOS) transistor 506 of the CMOS transistor is formed by the gate structure 112, and the source/drain 502. The P channel MOS (PMOS) transistor 508 of the CMOS transistor is formed by the gate structure 110, and the source/drain 504.

The prior art requires the patterned cap layer 302 to be the hard mask of the recess 400 etching process and the SEG process of the PMOS transistor 508. Forming the patterned cap layer 302 is a necessary process in the prior art. The cap layer, however, which is 300 to 400 angstroms, is deposited on the substrate 102. An etching process is performed on the cap layer to form the patterned cap layer 302. Without the patterned cap layer 302, the etching process on the cap layer cannot be performed completely, and a partial cap layer will remain on the N well 104. The un-etched cap layer on the substrate 102 means the recess 400 etching process cannot form the ideal recess 400, and the transistor cannot have optimum performance. The recess etching process 400 influences the pitch of the poly-line of the gate structure, so the influence on the transistor is huge.

SUMMARY OF THE INVENTION

The present invention relates to a method of manufacturing a CMOS to solve the problem of the prior art.

One embodiment of the present invention provides a method of manufacturing a CMOS. A substrate of the method has a first well, a second well, and an insulation between the first well and the second well. A first gate structure is deposited on the first well and a second gate structure is deposited on the second well. A dielectric layer and one etching process are utilized to form a first block layer on the second well, and a first spacer around the first gate. Next, first dopant regions are formed in the substrate outside the two lateral sides of the first spacer around the first gate structure by implanting dopant. First recesses are formed in the substrate outside the first spacer around the first gate structure by an etching process. A first epitaxial layer is formed in each first recess by an epitaxial growth process.

The present invention does not need to deposit a cap layer on the substrate, and therefore does not influence the continuous recess etching process as in the prior art. The present invention forms a patterned block layer utilizing the dielectric layer, which forms the spacer. The spacer etching process forms the patterned block layer, and the process of removing the spacer can remove the block layer. Therefore, the manufacture of the present invention is simpler than the prior art.

These and other objectives of the present invention will no doubt become obvious to those of ordinary skill in the art after reading the following detailed description of the preferred embodiment that is illustrated in the various figures and drawings.

DETAILED DESCRIPTION

The present invention relates to a method of forming a PMOS transistor, an NMOS transistor, and a CMOS transistor. It applies to strained-silicon MOS transistors or a selective epitaxial growth (SEG) process that builds the source/drain of the transistor high.

Figure 6:
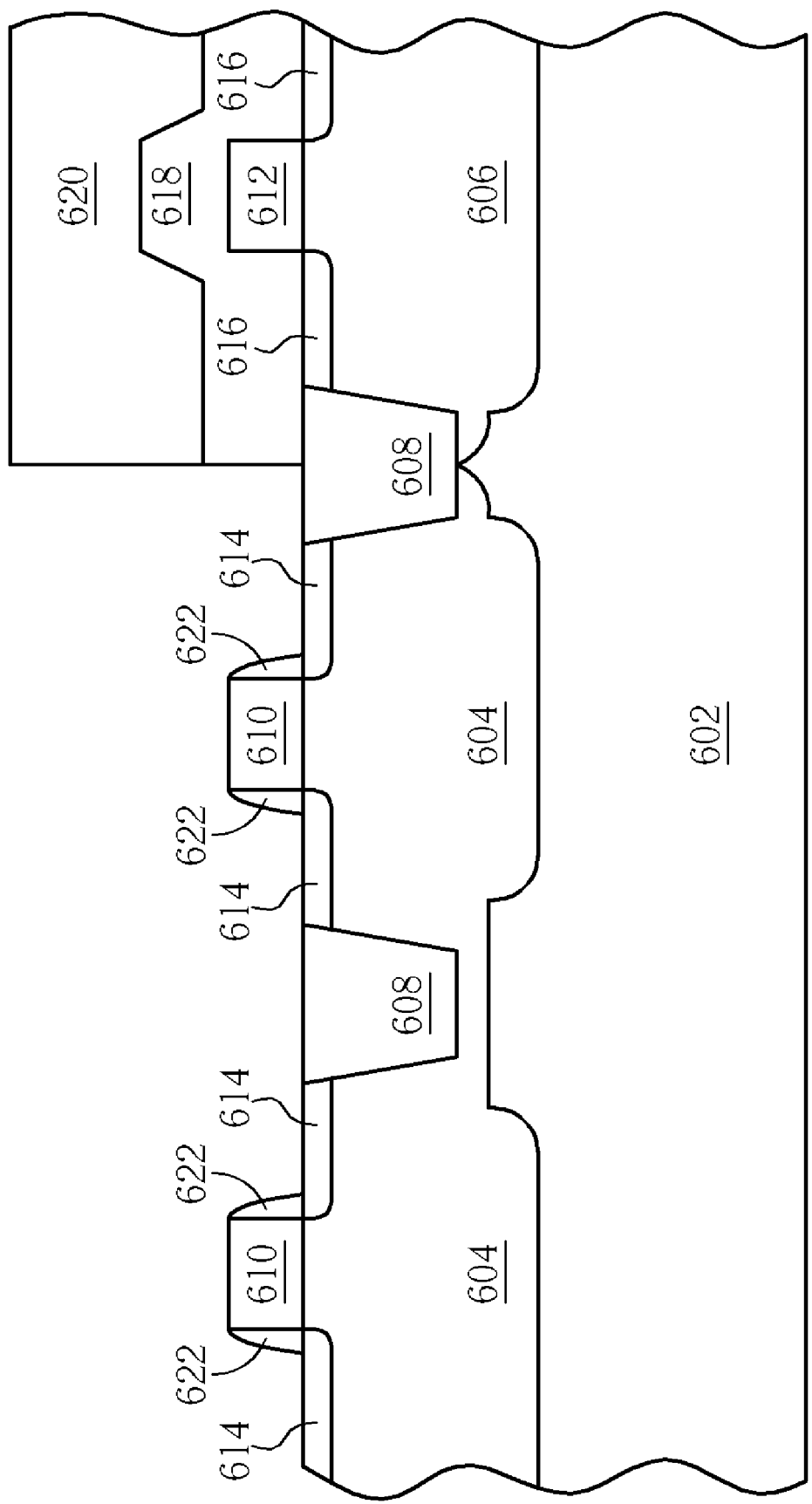
FIGS. 6 to 11 are schematic diagrams of manufacturing a CMOS transistor according to the first embodiment of the present invention.

Please refer to FIGS. 6 to 11. FIGS. 6 to 11 are schematic diagrams of manufacturing a CMOS transistor according to the first embodiment of the present invention. As FIG. 6 shows, a substrate 602 could be a P type silicon substrate, an N type silicon substrate, or a silicon on insulation (SOI) in the first embodiment. The substrate 602 includes an N well 604, a P well 606, and a shallow trench isolation (STI) 608. A plurality of gate structures 610 and 612 are deposited on the substrate 602. The gate structure 610 is formed on the N well 104; the gate structure 612 is formed on the P well 606, and the STI 608 is formed between the adjacent gate structures 610 and 612 in the substrate 602. The gate structures 610, 612 are stacks made by the conductive material such as a polysilicon and a gate dielectric layer. A light ion implanting process is performed by a mask (not shown) to form P type light dopant regions 614 in the two lateral sides of the gate structure 610 and in the N well 604. Another light ion implanting process is then performed by another mask (not shown) to form N type light dopant regions 616 in the two lateral sides of the gate structure 612 and in the P well 606. The sequence of forming the P type light dopant region 614 and the N type light dopant region 616 could be alternated. In this embodiment, the N-PKT could selectively be implanted outside the P type light dopant region 614, and the P-PKT could selectively be implanted outside the N type light dopant region 614 to avoid leakage.

Next, a dielectric layer (not shown) is deposited on the substrate 602 and covers the gate structures 610, 612 completely. A patterned photo-resist layer 602 is formed on the dielectric layer. The patterned photo-resist layer 620 only covers the P well 606, and does not cover the N well 604. An anisotropic etching process is performed on the dielectric layer, and the patterned photo-resist layer 620 is the etching mask for forming the spacer 622 around the gate structure 610 on the N well 604. The dielectric layer on the P type well 606 will not be etched, because it is covered by the patterned photo-resist layer 602. A block layer 618 is formed.

Figure 7:
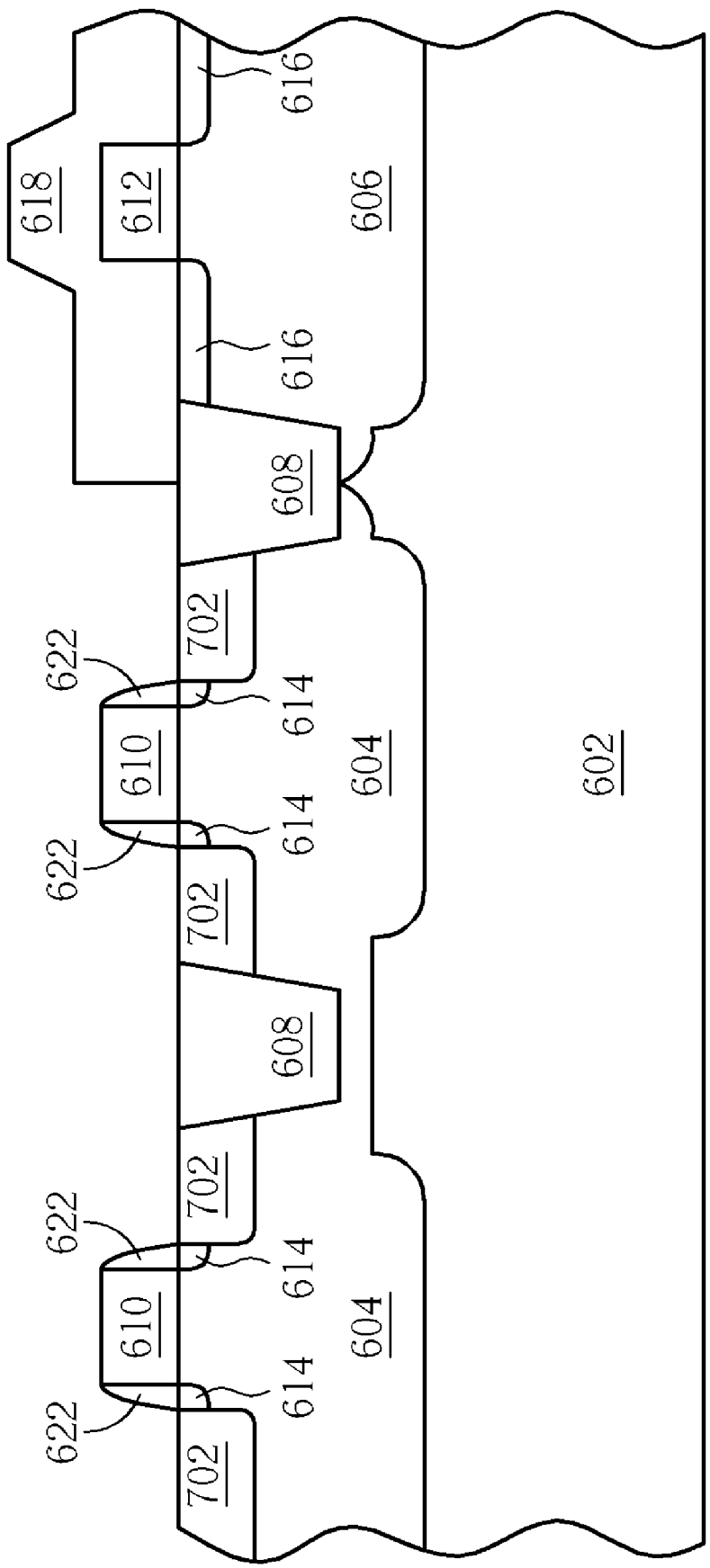

Please refer to FIG. 7. The gate structure 610, the spacer 622, the photo-resist layer 602, and the block layer 618 form a mask. A P− ion implanting process is performed to form the P− dopant region 702 between the spacer 622 and the STI 608 and in the N well 604. Next, the patterned photo-resist layer 602 is removed.

Figure 8:
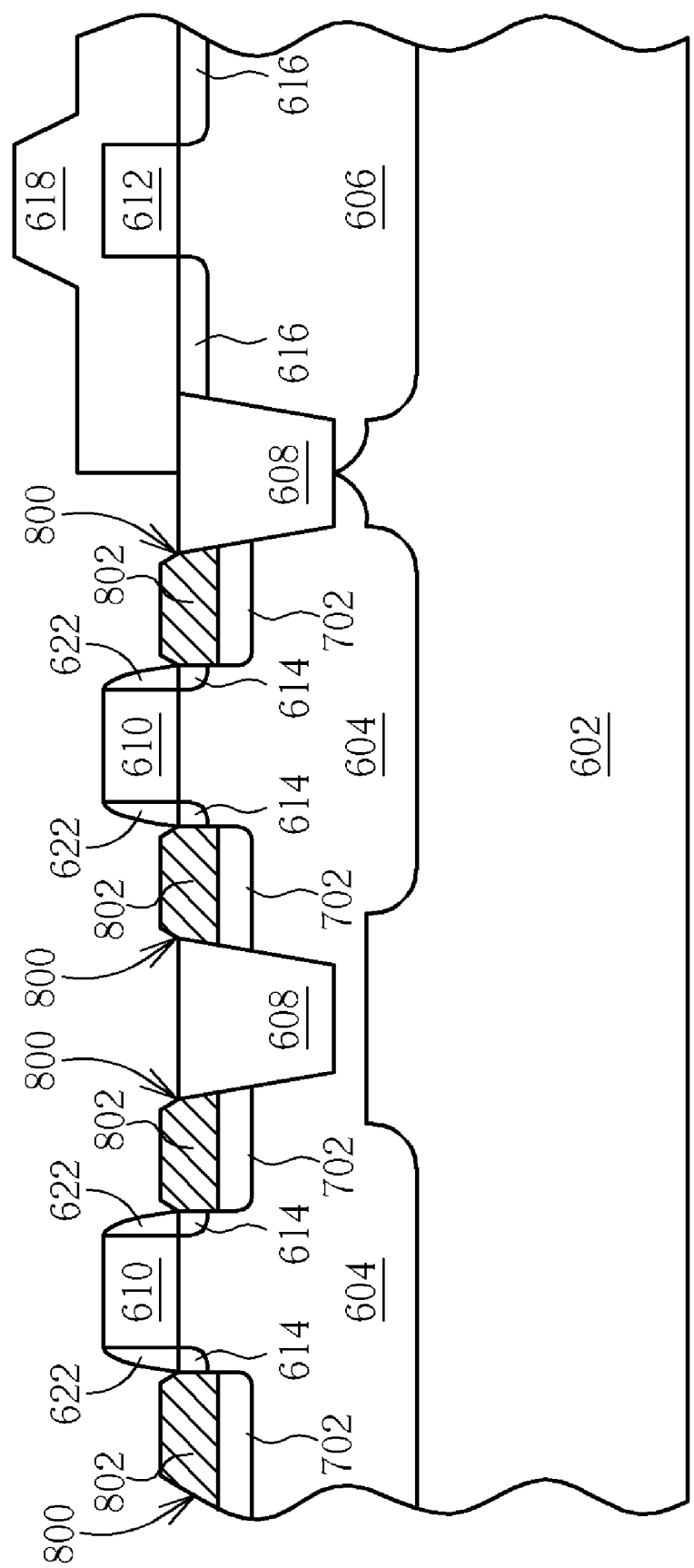

Please refer to FIG. 8. As mentioned above, the gate structure 610, the spacer 622, and the block layer 618 form the mask. An etching process is performed to form a recess 800 between the spacer 622 and the STI 608, and retain the partial P− dopant region 702. Next, a SEG process is performed to form an epitaxial layer 802 in each recess 800. The material of the epitaxial layer 802 is silicon, SiGe etc.

Figure 9:
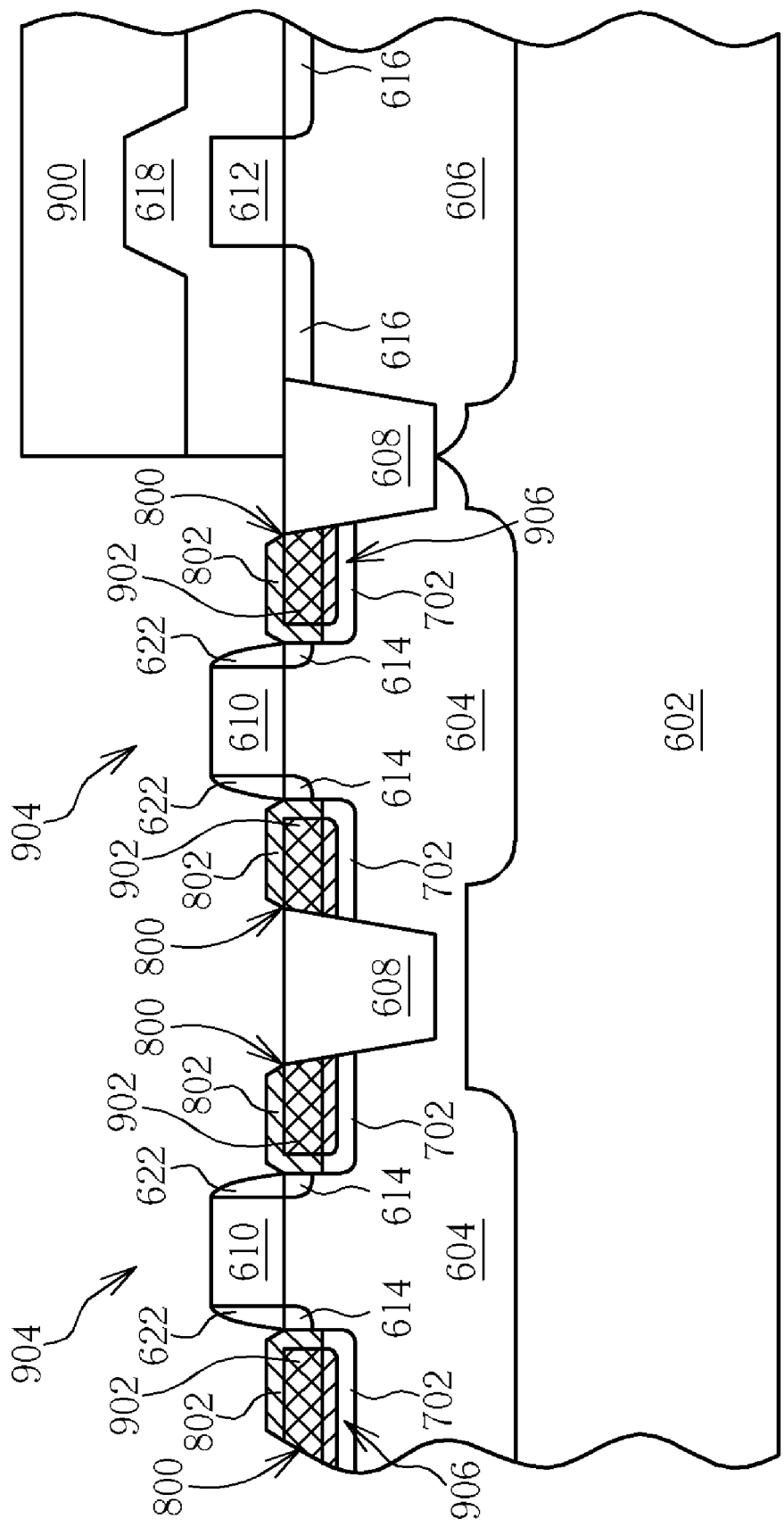

Please refer to FIG. 9. A patterned photo-resist layer 900 is formed on the block layer 618. The gate structure 610, and the spacer 622 form the mask. A P+ ion implanting process is performed to form a source/drain 902 between the spacer 622 and the STI 608 and in the epitaxial layer 802. The source/drain 902 is an P+ dopant region. The patterned photo-resist layer 900 is then removed. The PMOS transistor 904 of the CMOS transistor in the first embodiment is made by the gate structure 610 and the source/drain 902.

Figure 10:
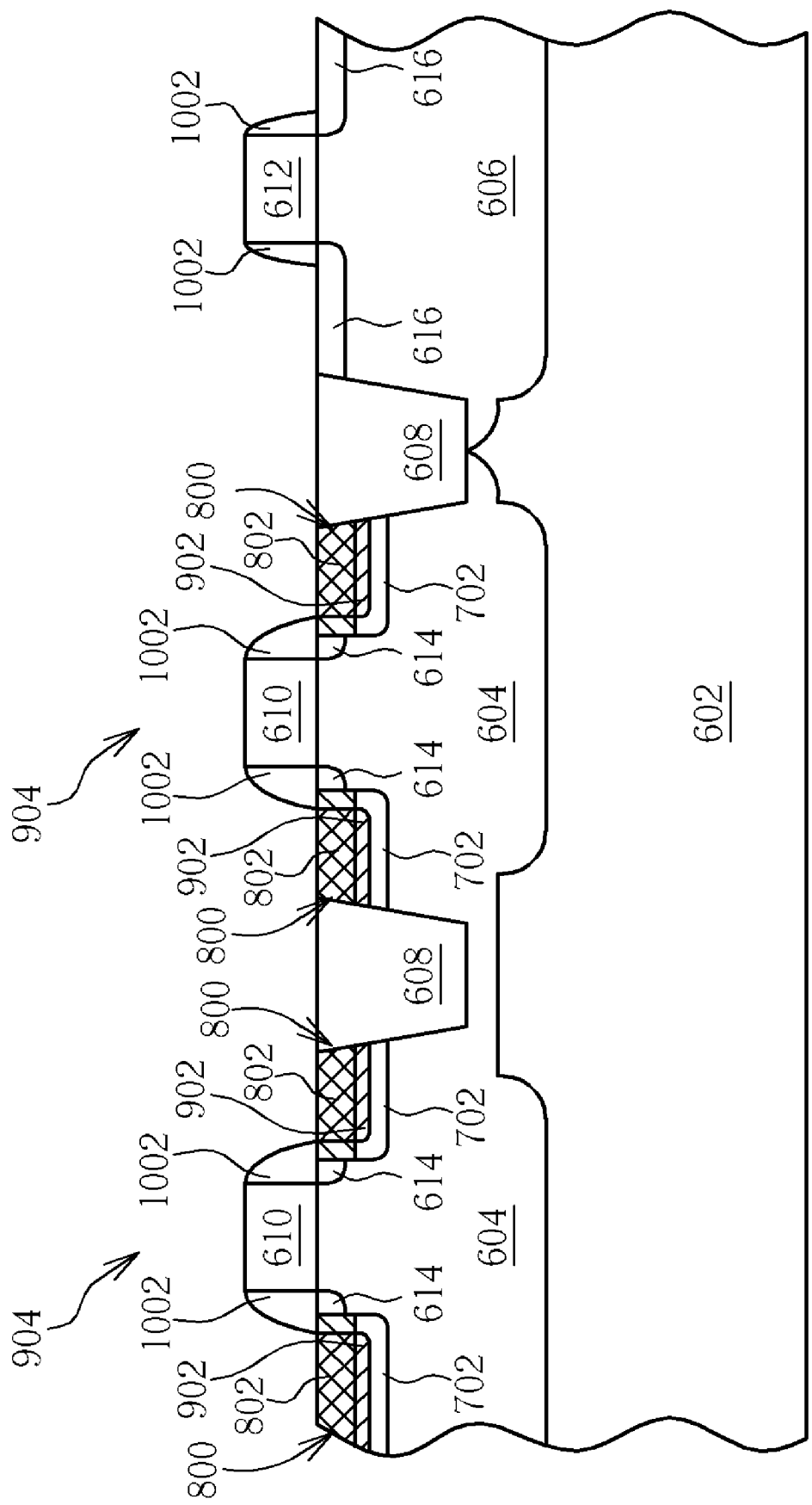

Please refer to FIG. 10. The block layer 618, and the spacer 622 are removed. A dielectric layer (not shown) is deposited on the substrate 602. An anisotropic etching process is performed on the dielectric layer to form a spacer 1002 around the gate structures 610, 612.

Figure 11:
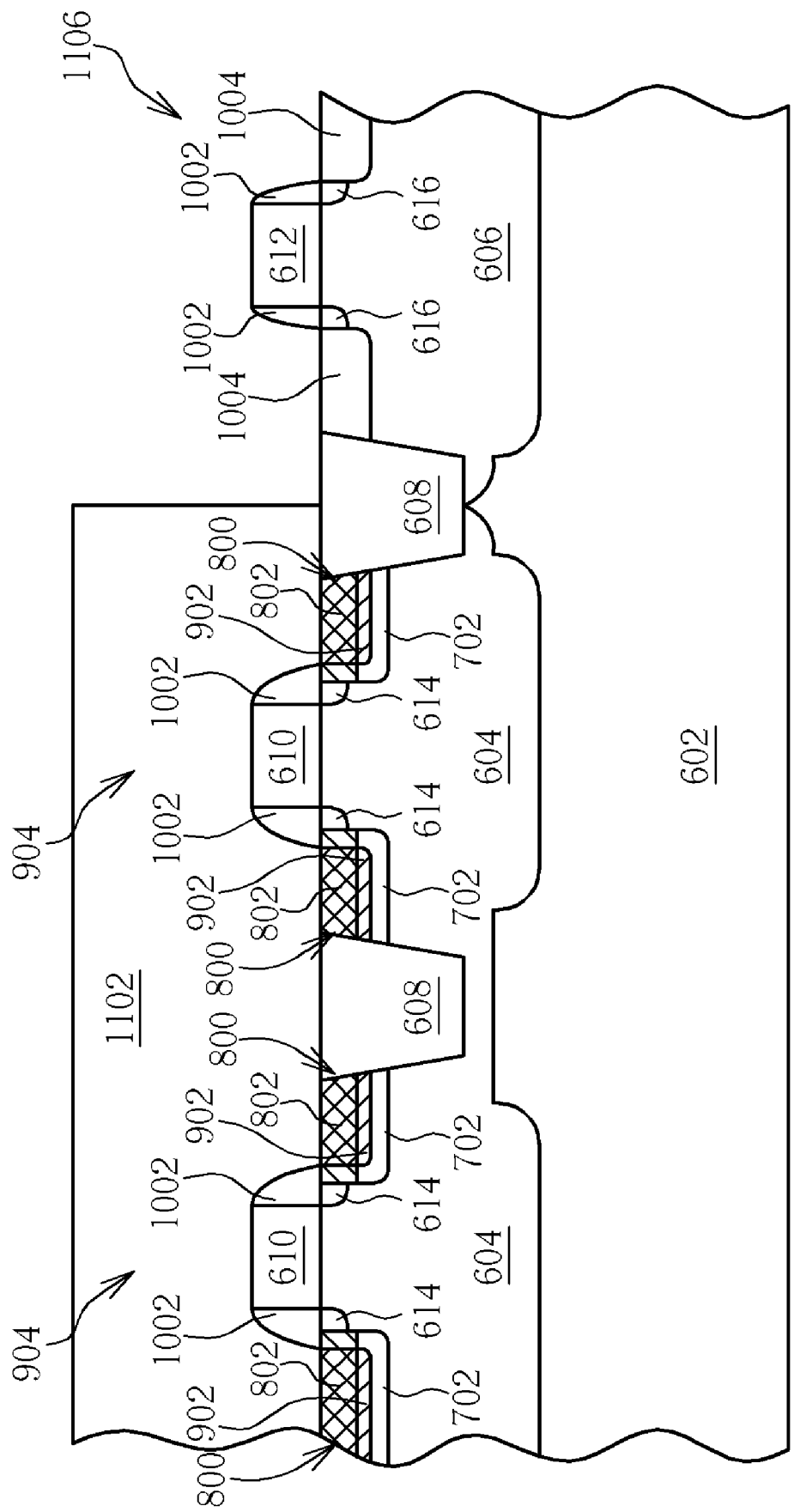

Please refer to FIG. 11. A patterned photo-resist layer 1102 covers the N well 604. Next, an N+ ion implanting process is performed to form a source/drain 1104 between the spacer 1002 and the STI 608 and in the P well 606. The source/drain 1104 is an N+ dopant region. Afterwards, the patterned photo-resist layer 1102 is removed. The NMOS transistor 1106 of CMOS transistor is made by the gate structure 612 and the source/drain 1104. Subsequently, an annealing process is performed to active the dopant in the substrate 602 to repair the crystal lattice of the damaged substrate 602 surface. Finally, the CMOS transistor of the first embodiment according to the present invention is completed.

In the first embodiment of the present invention, the PMOS transistor 904 of the CMOS transistor has the epitaxial layer; but the NMOS transistor 1106 does not have the epitaxial layer. In other modifications of the present invention, the PMOS transistor 904 and the NMOS transistor 1106 both have an epitaxial layer. The related manufacture is described in the following.

Figure 1:
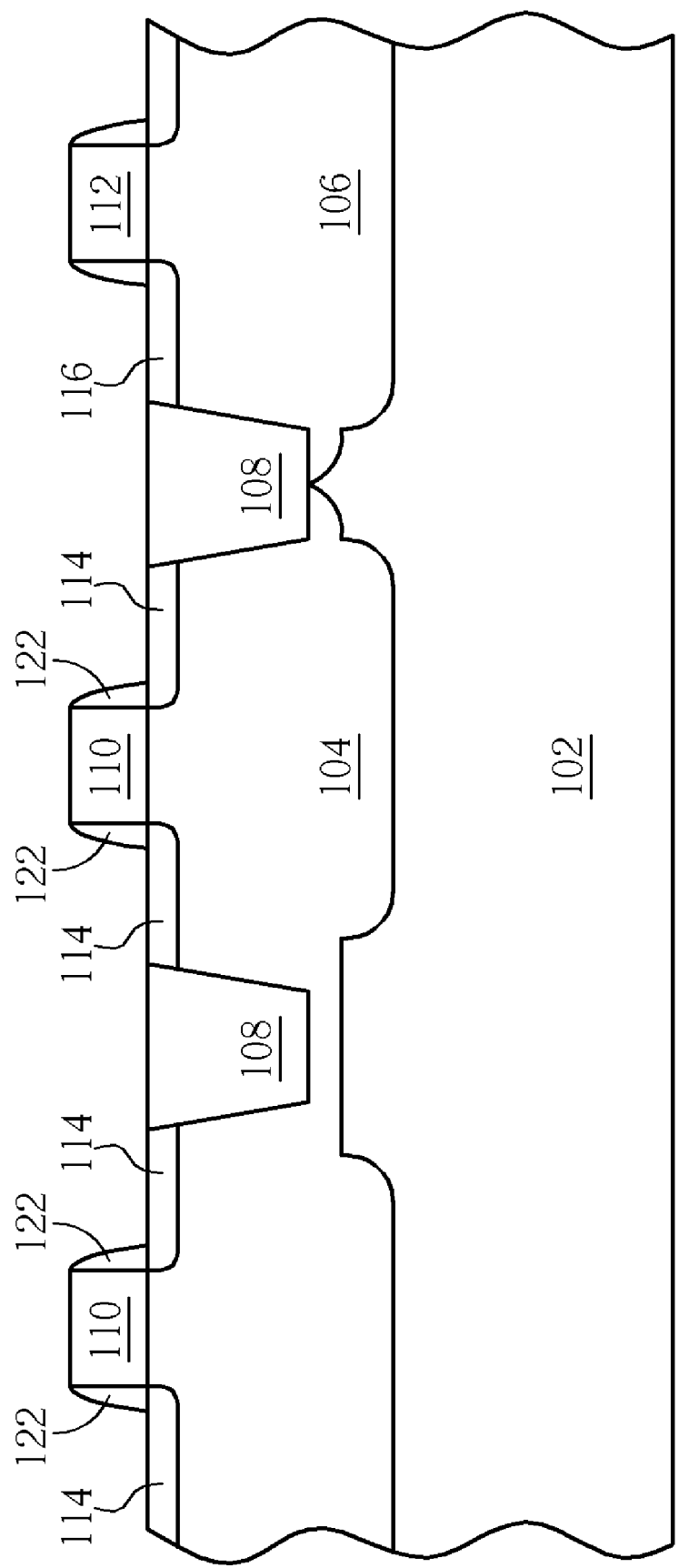
FIGS. 1 to 5 are schematic diagrams of manufacturing a CMOS transistor according to the prior art.
Figure 2:
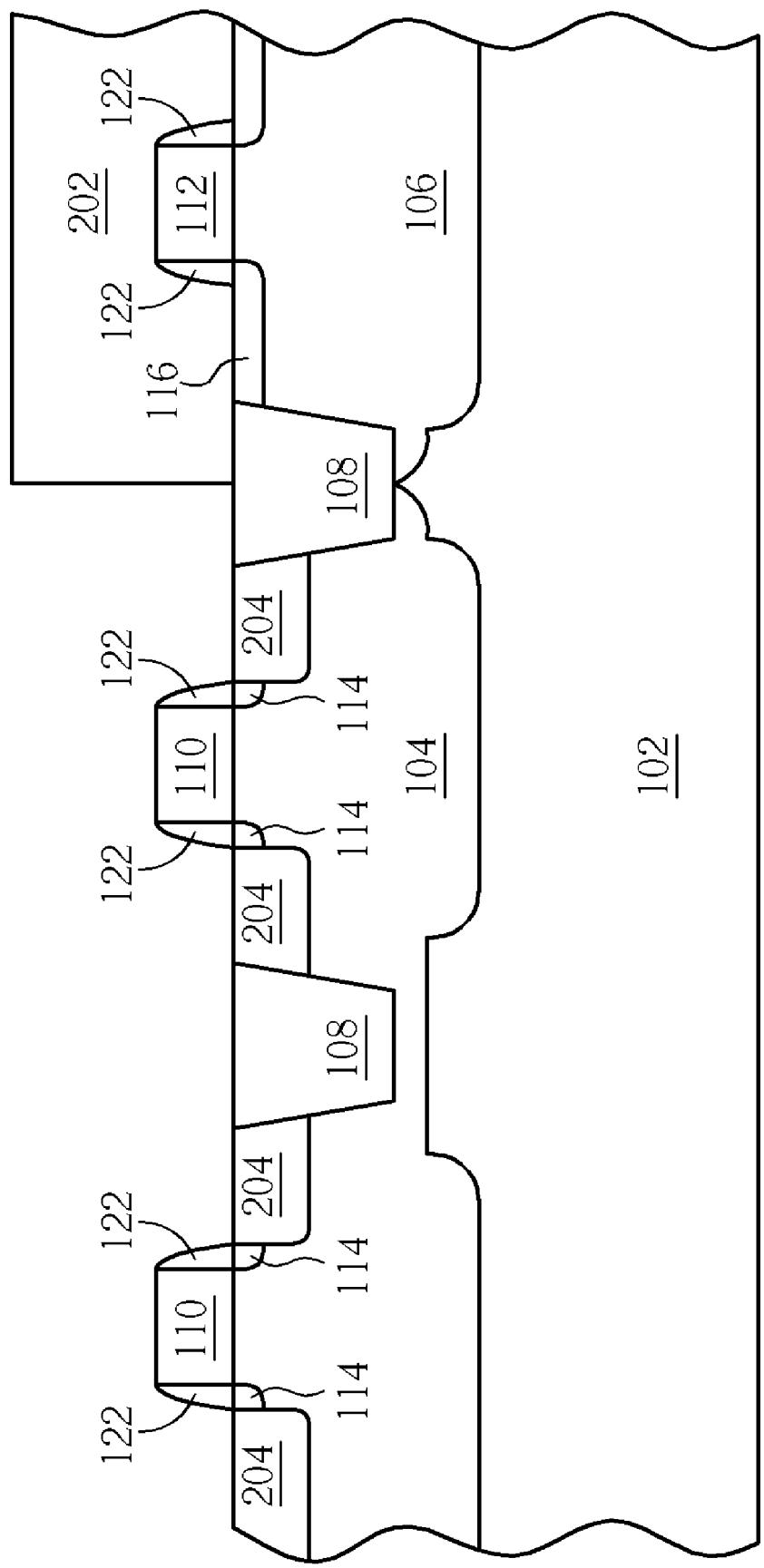
Figure 3:
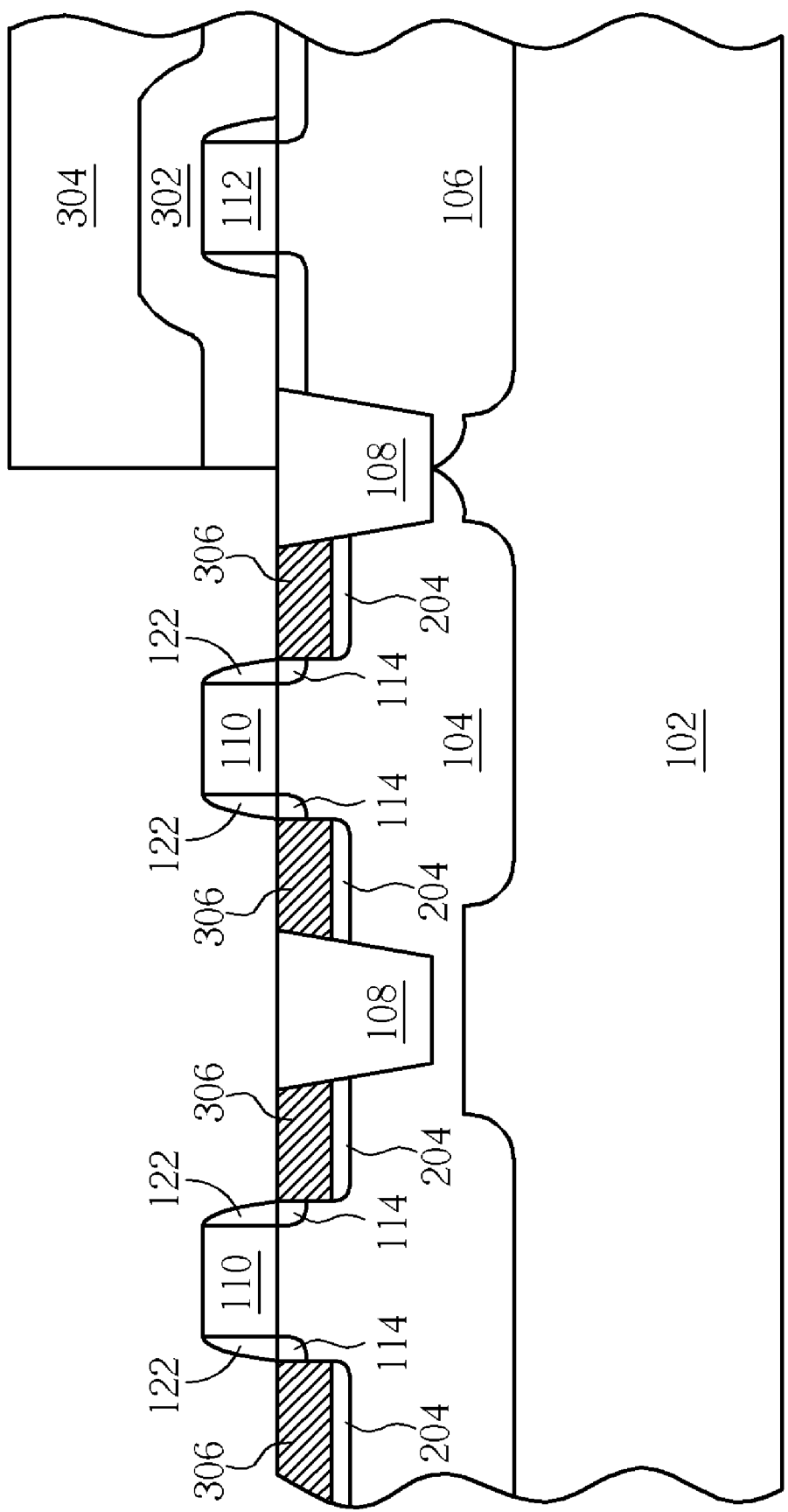
Figure 4:
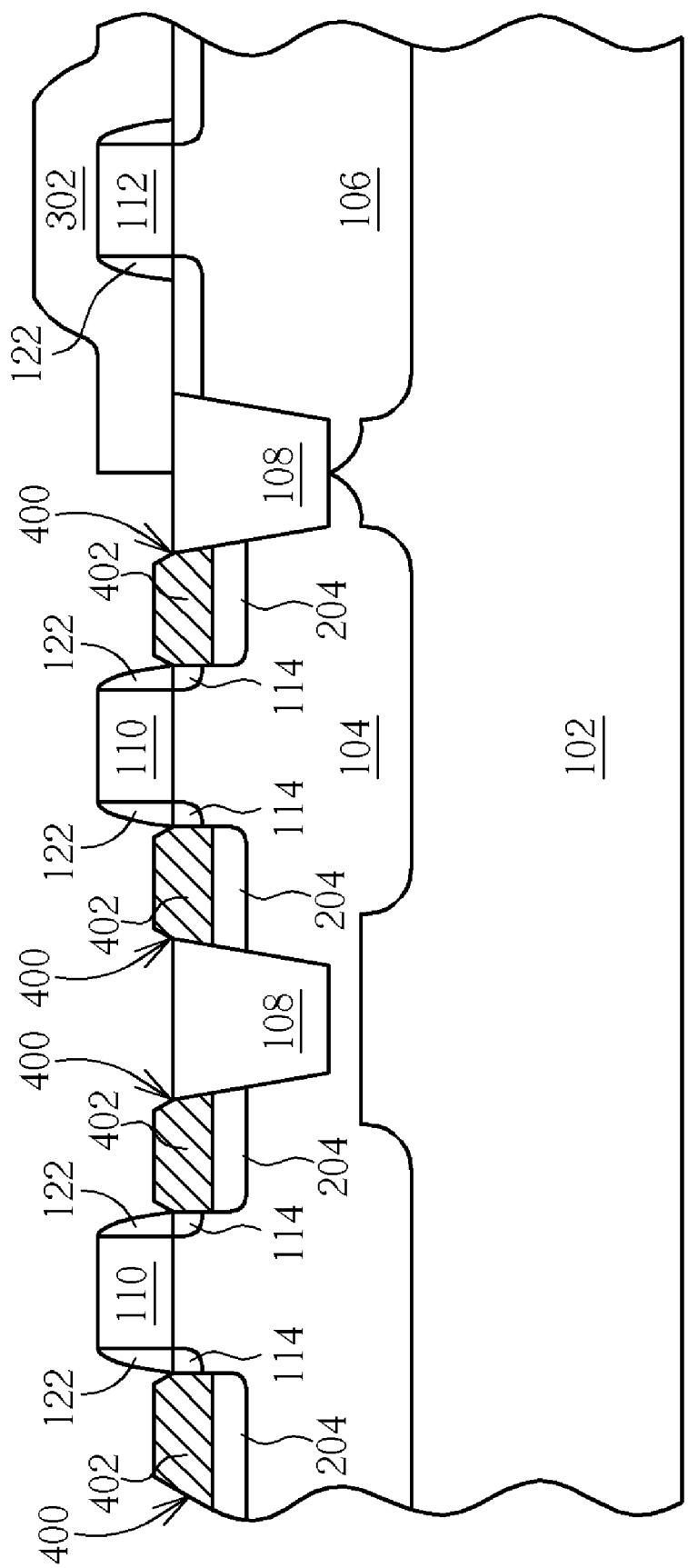
Figure 5:
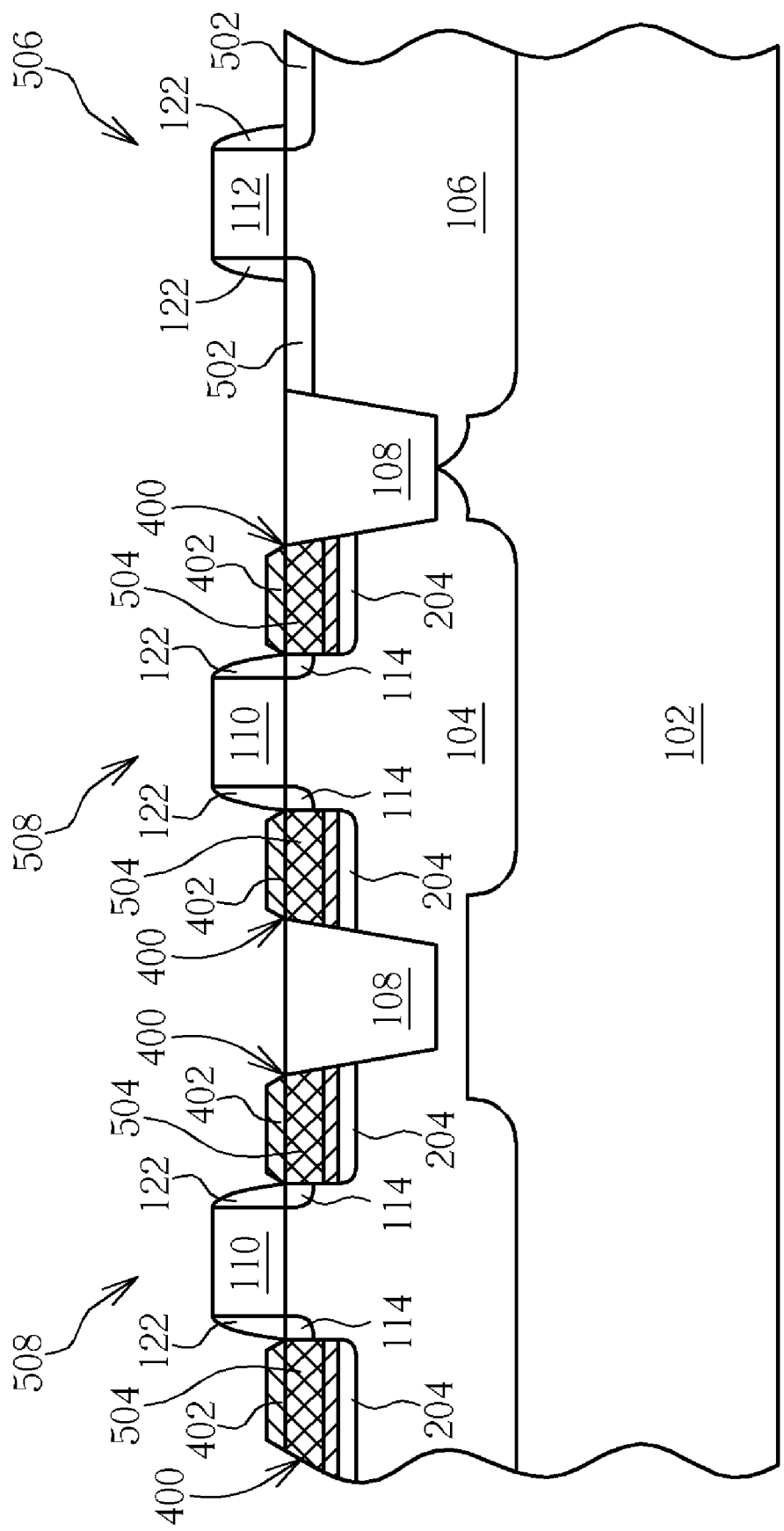
Figure 12:
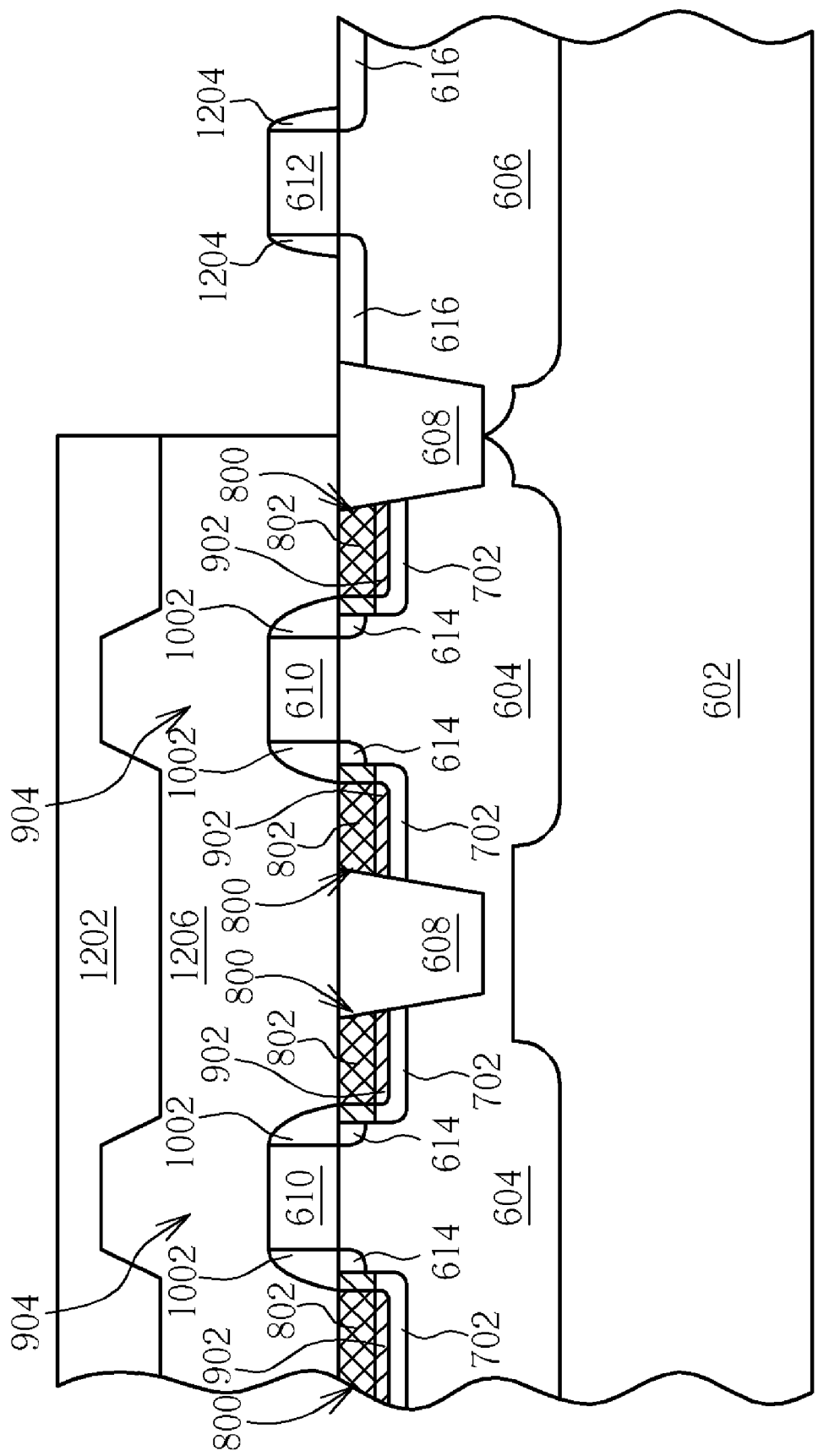
FIGS. 12 to 15 are schematic diagrams of partial manufacture of the CMOS transistor according to the second embodiment of the present invention.

Please refer to FIGS. 12 to 15. FIGS. 12 to 15 are schematic diagrams of partial manufacture according to a second embodiment of the present invention. After the PMOS transistor 904 of the first embodiment is completed, further processes are performed, as illustrated in FIGS. 12 to 1 5. In other words, the entire method according to the second embodiment is illustrated by FIGS. 6-9 and FIGS. 12-15.

As FIG. 12 shows, when the PMOS transistor 904 is completed, the block layer 618 and the spacer 622 are removed. A dielectric layer (not shown) is deposited on the substrate 602 and covers the gate structures 610, 612. Next, a patterned photo-resist layer 1202 is formed on the dielectric layer, where the patterned photo-resist layer 1202 only covers the N well 604 and does not cover the P well 606. Next, an anisotropic etching process is performed on the dielectric layer to form a spacer 1204 around the gate 612 on the P well 606 and to form a block layer 1206 on the N well 604, because the dielectric layer on the N well 604 is not covered by the patterned photo-resist layer 620.

Figure 13:
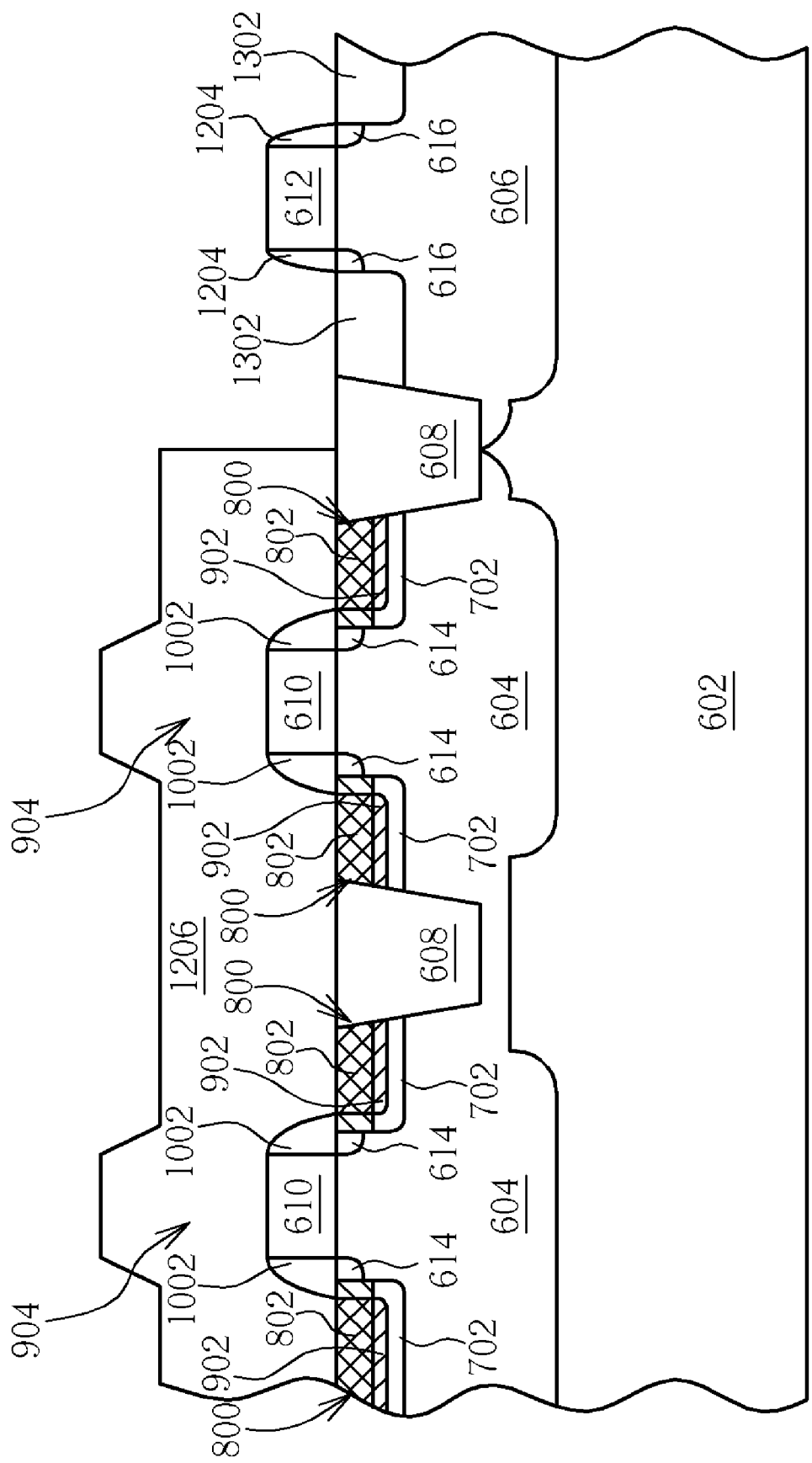
Figure 14:
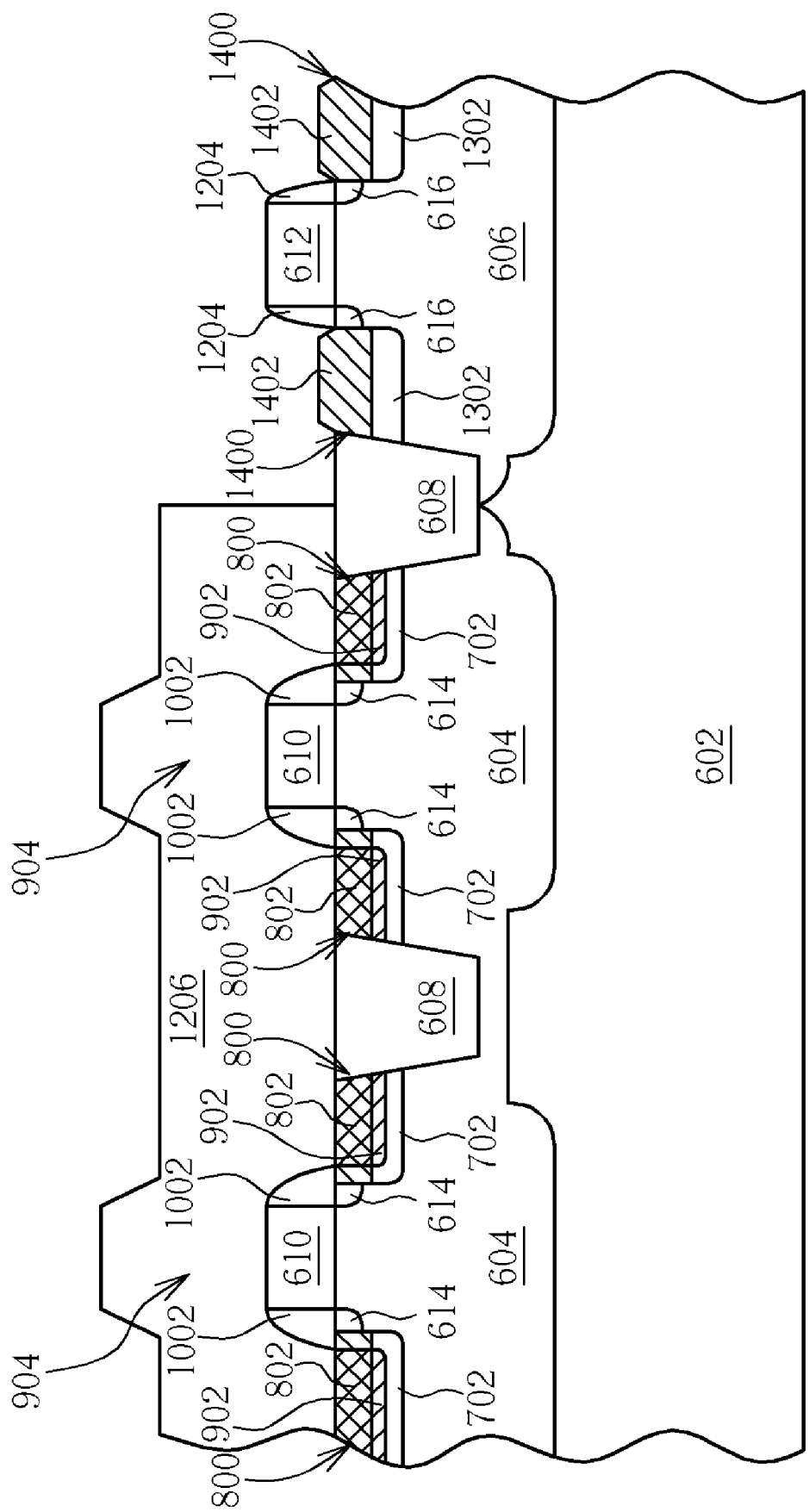

Please refer to FIG. 13. The gate structure 612, the spacer 1204, the patterned photo-resist layer 1202, and the block layer 1206 are the masks. An N− ion implanting process is performed to form an N− dopant region 1302 between the spacer 1204 and the STI 608 and in the P well 606. Please refer to FIG. 14, which illustrates the method proceeding from after the patterned photo-resist layer 1202 is removed. The gate structure 612, the spacer 1204, and the block layer 1206 are the masks. An etching process is performed to form a recess 1400 between the spacer 1204 and the STI 608 and in the P well 606, and retain the partial N− dopant region 1302. Next, a SEG process is performed to form the epitaxial layer 1402 in each recess. The material of the epitaxial layer 1402 is silicon or SiC.

Figure 15:
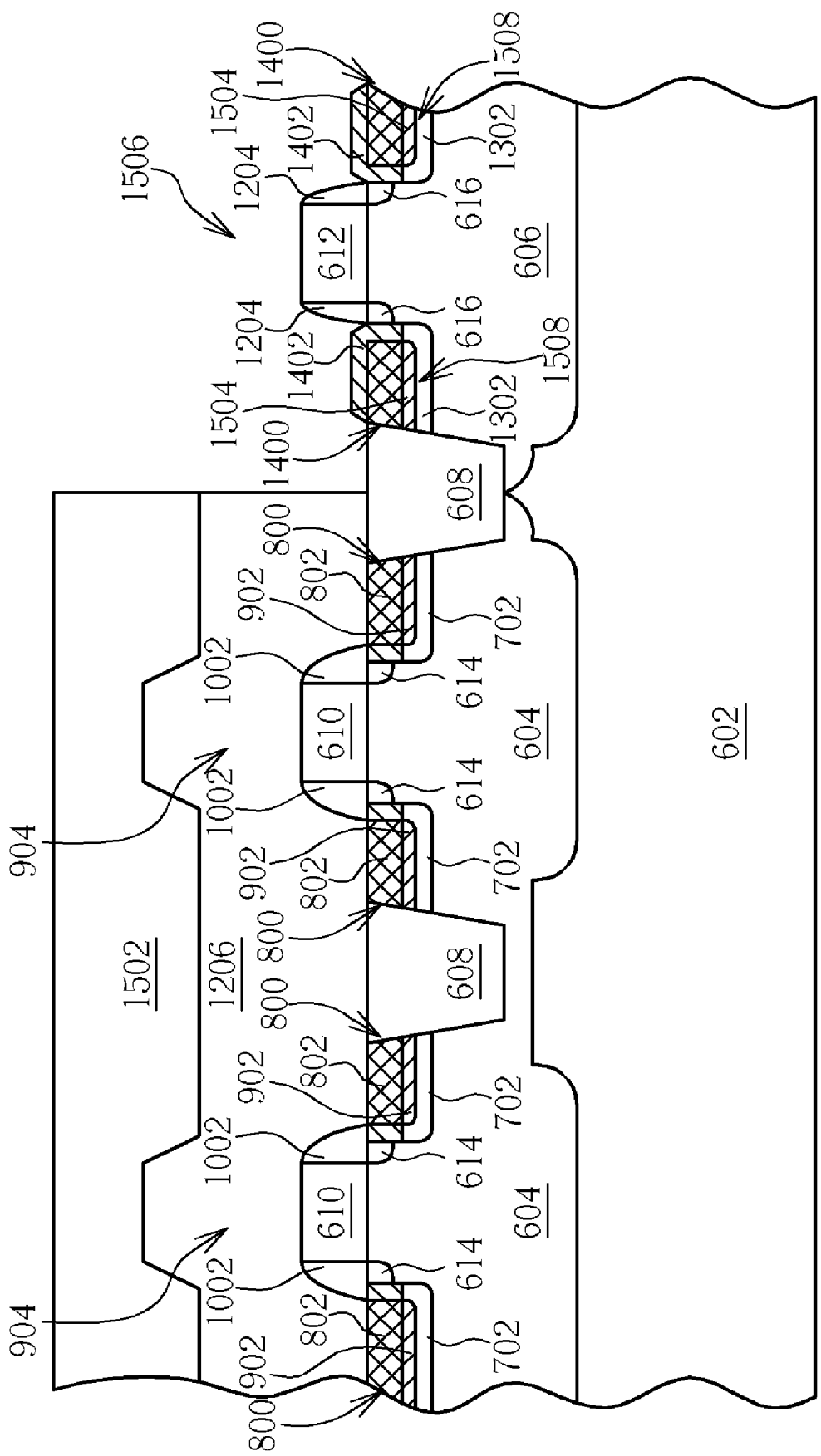

Please refer to FIG. 15. A patterned photo-resist layer 1502 is formed on the block layer 1206. At this point, the gate structure 612, and the spacer 1204 are the mask. An N+ ion implanting process is performed to form the source/drain 1504 of the epitaxial layer 1402 between the spacer 1204 and the STI 608. The source/drain 1504 are N+ dopant regions. Finally, the patterned photo-resist layer 1502 is removed. The NMOS transistor 1506 of the CMOS transistor in this embodiment is made by the gate structure 612 and the source/drain 1504.

Please note that there is a space between the P− dopant region 702 and the bottom and the lateral side of the source/drain 902 to form a buffer region 906 for preventing junction leakage in both the first and second embodiments of the present invention, because the angles of the ion implanting process can be adjusted and the etching process can be controlled. Of course, the same principle can be applied to form the N− dopant region 1302 and the source/drain 1504. There is a buffer region 1508 between the formed N− dopant region 1302 and the bottom and the lateral side of the source/drain 1504 to prevent junction leakage, because the angles of the N− dopant implanting process and the source/drain implanting process are different.

The present invention does not need to deposit a cap layer on the substrate, therefore continuous recess etching process will not be influenced as in the prior art. The present invention forms the patterned block layer utilizing the dielectric layer, which forms the spacer. The spacer etching process forms the patterned block layer, and the process of removing the spacer can also remove the block layer. Therefore, the manufacture of the present invention is simpler than the prior art. The poly-line of the gate structure can thereby be smaller. Furthermore, the epitaxial layer has a better effect of providing strain to the substrate, and the performance of the transistor is improved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing complementary metal oxide semiconductor transistor (CMOS), comprising:
    providing a substrate comprising at least a first well, at least a second well, and an insulation between the first well and the second well;
    forming at least a first gate structure having at least one sidewall on the first well, a second gate structure on the second well;
    depositing a first dielectric layer on the first gate structure and the second gate structure and performing one etching process to form the first dielectric layer into a first block layer on the second well and at least a first spacer along the sidewall of the first gate structure and expose the other substrate surface on the first well;
    forming a plurality of first dopant regions in the substrate around the first gate structure by implanting dopant after forming the first block layer on the second well;
    utilizing the first block layer formed with the first spacer as mask to form a plurality of first recesses in the substrate outside the first spacer around the first gate structure by an etching process;
    forming a plurality of first epitaxial layers in the first recesses; and
    forming a plurality of second dopant regions in the substrate outside the first spacer around the first gate structure by implanting dopant after the first epitaxial layer.

2. The method of claim 1, wherein the steps of forming the first block layer and the first spacer comprises:
    depositing the first dielectric layer on the substrate, the first gate structure, and the second gate structure;
    forming a patterned photo-resist layer on the first dielectric layer;
    utilizing the first patterned photo-resist layer as a mask to perform a first dielectric layer etching process on the first dielectric layer, forming a first block layer on the second well and at least one first spacer around the first gate structure.

3. The method of claim 1, wherein the first type well is an N well, and the second type well is a P well.

4. The method of claim 1 further comprising the following steps after forming the second dopant region:
    removing the first spacer and the first block layer;
    forming a second spacer around the first and second gate structures; and
    forming the source/drain of the second gate structure in the substrate outsides the two lateral sides of the second spacer around the second gate structure by implanting dopant.

5. The method of claim 1 further comprising the following steps after forming the second dopant region:
    removing the first spacer and the first block layer;
    utilizing a second dielectric layer and the same etching process to form a second block layer on the first well, and to form at least one third spacer around the second gate;

forming a plurality of fourth dopant regions in the substrate outside the two lateral sides of the third spacer around the second gate structure;

forming a plurality of second recesses in the substrate outside the two lateral sides of the third spacer around the second gate structure; and forming a second epitaxial layer in each second recess.

6. The method of claim 3, wherein the first dopant region is a P− dopant region, and the second dopant region is a P+ dopant region.

7. The method of claim 6, further comprising forming a buffer region between the first dopant region and the second dopant region to prevent junction leakage.

8. The method of claim 7, wherein the first gate structure is the gate structure of the P channel MOS (PMOS) in the CMOS, the second dopant regions are the source/drain of the PMOS.

9. The method of claim 4, wherein the source/drain of the second gate structure are N+ dopant regions.

10. The method of claim 9, wherein the second gate structure is the gate structure of an N channel MOS (NMOS) of the CMOS.

11. The method of claim 5, further comprising a plurality of fifth dopant regions in the substrate outside the third spacer by implanting dopant after forming a second epitaxial layer.

12. The method of claim 11, wherein the fourth dopant region is an N− dopant region, and the fifth dopant region is an N+ dopant region.

13. The method of claim 12, wherein the first epitaxial layers are silicon or SiGe, and the second epitaxial layers are silicon or SiC.

14. The method of claim 13, wherein the second gate structure is the gate structure of the NMOS of the CMOS.

* * * * *